US012787861B2

(12) United States Patent
Goh et al.

(10) Patent No.: US 12,787,861 B2
(45) Date of Patent: Nov. 3, 2026

(54) MEMORY ON PACKAGE (MOP) ARCHITECTURE

(71) Applicant: Intel Corporation, Santa Clara, CA (US)

(72) Inventors: Eng Huat Goh, Ayer Itam (MY); Telesphor Kamgaing, Chandler, AZ (US); Chee Kheong Yoon, Bayan Lepas (MY); Jooi Wah Wong, Bukit Mertajam (MY); Min Suet Lim, Gelugor (MY); Kavitha Nagarajan, Bangalore (IN); Chu Aun Lim, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 347 days.

(21) Appl. No.: 17/833,589

(22) Filed: Jun. 6, 2022

(65) Prior Publication Data

US 2023/0395576 A1 Dec. 7, 2023

(51) Int. Cl.

| | |
|---|---|
| ***H01L 25/10*** | (2006.01) |
| ***H10W 42/00*** | (2026.01) |
| ***H10W 76/40*** | (2026.01) |
| ***H10W 90/00*** | (2026.01) |
| *H10W 90/20* | (2026.01) |
| *H10W 90/24* | (2026.01) |

(52) U.S. Cl.
CPC ......... *H10W 90/00* (2026.01); *H10W 42/121* (2026.01); *H10W 76/40* (2026.01); *H10W 90/24* (2026.01); *H10W 90/291* (2026.01); *H10W 90/754* (2026.01)

(58) Field of Classification Search
CPC ..... H01L 25/105; H01L 23/16; H01L 23/562; H01L 25/50; H10W 90/00; H10W 42/121; H10W 76/40; H10W 90/24
See application file for complete search history.

(56) References Cited

U.S. PATENT DOCUMENTS

| | | | | |
|---|---|---|---|---|
| 9,847,319 B2 * | 12/2017 | Song | H10W 42/121 |
| 11,557,541 B2 * | 1/2023 | Hossain | H05K 1/141 |
| 12,381,193 B2 * | 8/2025 | Gomes | H10B 12/50 |
| 2020/0105719 A1 * | 4/2020 | Li | H10W 70/09 |
| 2021/0098421 A1 * | 4/2021 | Wu | H10P 72/74 |
| 2021/0335698 A1 * | 10/2021 | Cheah | H10W 40/22 |
| 2021/0375846 A1 * | 12/2021 | Chen | H10P 54/00 |
| 2023/0207436 A1 * | 6/2023 | Elsherbini | H10W 44/20 257/667 |
| 2024/0063200 A1 * | 2/2024 | Niu | H10B 80/00 |

* cited by examiner

*Primary Examiner* — Thao P Le
(74) *Attorney, Agent, or Firm* — Schwabe, Williamson & Wyatt, P.C.

(57) ABSTRACT

Embodiments disclosed herein include electronic packages. In an embodiment, an electronic package comprises a package substrate with a first memory die stack on the package substrate, and a second memory die stack on the package substrate. In an embodiment, an electrically insulating layer is provided over the first memory die stack and the second memory die stack. In an embodiment, an opening is provided through the electrically insulating layer, and a die module is in the opening over the package substrate.

20 Claims, 14 Drawing Sheets

MEMORY ON PACKAGE (MOP) ARCHITECTURE

TECHNICAL FIELD

Embodiments of the present disclosure relate to electronic packages, and more particularly to packaging architectures that include memory stacks that are embedded in a mold layer that includes an opening for one or more compute dies.

BACKGROUND

Memory on package (MoP) architectures have been used in order achieve the best DDR performance and smallest SoC XY footprint. However, there are a few intrinsic issues that arise with existing MoP architectures. On issue is an increased Z-height. The addition of a tall memory package (e.g., a stack of memory dies on a memory package substrate) increases the Z-height of the device. For example, Z-heights may be increased by between 300 μm and 350 μm in some architectures. In some instances, the increase in the Z-height is mitigated by using a coreless package architecture. However, the use of a coreless architecture is an extremely expensive solution.

Additionally, the MoP architecture results in an overall SoC package XY form factor that is substantially large. This is due to the need to include a stiffener in order to control warpage of the package substrate. In some instances, a combination stiffener and integrated heat spreader (IHS) is used in order to control warpage and improve thermal performance. However, such architectures are expensive solutions.

EMBODIMENTS OF THE PRESENT DISCLOSURE

Described herein are packaging architectures that include memory stacks that are embedded in a mold layer that includes an opening for one or more compute dies, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
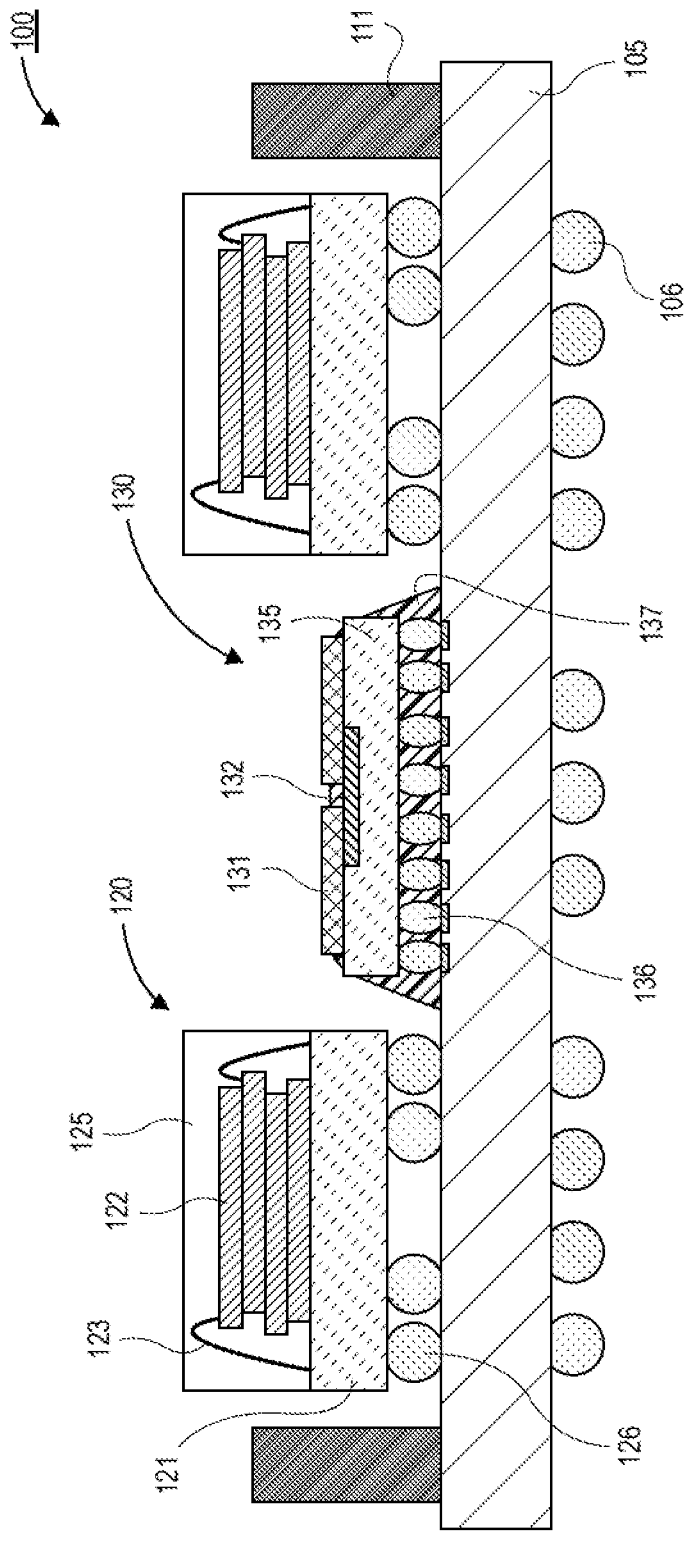
FIG. 1 is a cross-sectional illustration of a memory on package (MoP) architecture where the memory die stacks are provided on a package substrate that is connected to the main package substrate.

FIG. 1 is a cross-sectional illustration of an electronic package 100 used to provide context for embodiments described herein. The electronic package 100 includes an architecture where memory die stacks 120 are attached to a package substrate 105 adjacent to a die module 130. The package substrate 105 may include bumps 106 on a backside of the package substrate 105. The memory die stacks 120 and the die module 130 may be provided on the front side of the package substrate 105. For example, the memory die stack 120 may include bumps 126 that connect to the package substrate 105, and the die module 130 may include bumps 136 that connect to the package substrate 105. An underfill 137 may be provided around the bumps 136. While not shown, an underfill may also surround the bumps 126 between the memory die stack 120 and the package substrate 105.

In an embodiment, a mold layer 125 may be provided over and around the memory die stacks 120. The mold layer 125 may be an epoxy molding material or any other suitable material. In an embodiment, a thickness of the mold layer 125 may be greater than a height of the memory die stacks 120. The mold layer 125 may also embed the wire bonds 123.

The die module 130 may include any number of dies 131 in any architecture. For example, a pair of dies 131 may be coupled to each other through a bridge 132 embedded in an interposer 135. The die module 130 may be a system on a chip (SoC) or any other type of die or dies. The die module 130 may be communicatively coupled to the memory die stacks 120 through routing (not shown) on and/or in the package substrate 105.

The memory die stacks 120 may include a memory package substrate 121. A stack of memory dies 122 may be provided over the memory package substrate 121. The memory dies 122 may be electrically coupled to the memory package substrate 121 through wire bonds 123. Due to the presence of the memory package substrate 121, the length of the routing from the memory dies 122 to the die module 130 is long. This leads to larger delays and signal integrity issues. Additionally, the memory package substrate 121 results in an increase in the Z-height of the electronic package 100. A stiffener 111 may also be needed in order to mitigate warpage issues. The presence of the stiffener 111 increase the X-Y dimensions of the electronic package 100.

Accordingly, memory on package (MoP) architectures, such as the one shown in FIG. 1, have intrinsic drawbacks, such as increased Z-height and increased X-Y form factor. Accordingly, embodiments disclosed herein include MoP architectures that have a smaller Z-height and reduced XY form factor. Additionally, such architectures are made without relying on coreless package substrates. Accordingly, the solutions described herein are cost effective architectures as well.

Particularly, a package substrate is provided and memory die stacks are provided directly on the package substrate. The memory dies may be coupled to the package substrate directly through wire bonds. As such, there is no need for a memory package substrate between the memory dies and the main package substrate. This results in a decrease in the Z-height of the device. Additionally, the XY form factor is reduced by the use of mold layer around the memory die stacks. The mold layer allows for the elimination of the stiffener in some embodiments. That is, the mold layer improves the stiffness of the package substrate, and there may not be a need for a stiffener. However, in other embodiments, a stiffener may also be included. In such an embodiment, the stiffener may also be embedded in the mold layer.

Figure 2A:
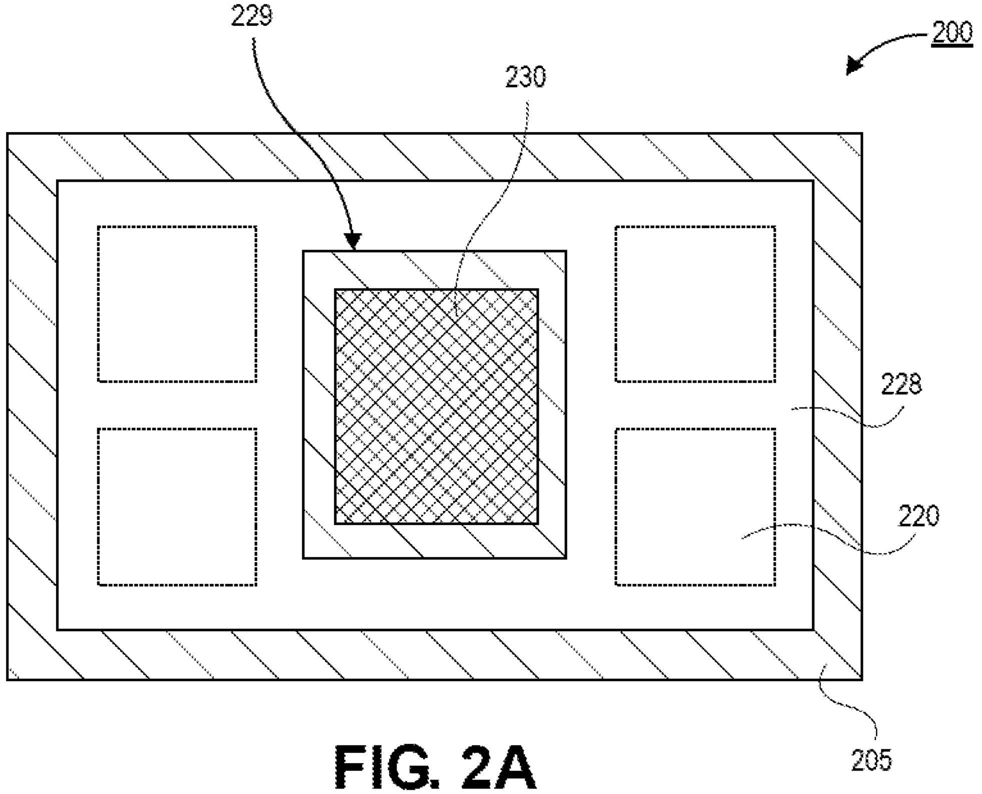
FIG. 2A is a plan view illustration of a MoP architecture with a mold layer over and around the memory die stacks and an opening in the mold layer to accommodate a die module, in accordance with an embodiment.

Referring now to FIG. 2A, a plan view illustration of an electronic package 200 is shown, in accordance with an embodiment. In an embodiment, the electronic package 200 may comprise a package substrate 205. The package substrate 205 may include a core and buildup layers over and under the core. Depending on the routing needs, the package substrate 205 may be a six layer package substrate 205, an eight layer package substrate 205, or a ten layer package substrate 205. That is, embodiments disclosed herein may include package substrates 205 with any number of routing layers. Since a core is used, the cost of the package substrate 205 is reduced and the stiffness is increased (compared to coreless architectures).

In an embodiment, a mold layer 228 may be provided over a top surface of the package substrate 205. The mold layer 228 may be an epoxy molding material or any other suitable material. In an embodiment, the mold layer 228 is an electrically insulating material. In an embodiment, the mold layer 228 has an outer perimeter that is smaller than an outer perimeter of the package substrate 205. However, the outer perimeter of the mold layer 228 may be substantially equal to the outer perimeter of the package substrate 205 in other embodiments. In an embodiment, the mold layer 228 may have an opening 229. The opening 229 may be sized to receive a die module 230. While shown as a single die in FIG. 2A, it is to be appreciated that the die module 230 may include one or more dies. The die module 230 may also include an interposer for coupling multiple dies together.

In an embodiment, a plurality of memory die stacks 220 may be embedded in the mold layer 228. For example, the die stacks 220 in FIG. 2A are shown with dashed lines in order to illustrate that the memory die stacks 220 are provided below the top surface of the mold layer 228. The memory die stacks 220 may be directly coupled to the package substrate 205. That is, the memory die stacks 220 may not need a memory package substrate between the memory dies and the package substrate 205, as is the case in the example shown in FIG. 1. This reduces the Z-height of the electronic package 200. Additionally, the omission of the memory package substrate reduces the length of the routing between the die module 230 and the memory die stack 220. In the illustrated embodiment, there are four memory die stacks 220. However, it is to be appreciated that any number of memory die stacks 220 may be used in accordance with various embodiments. For example, there may be one or more memory die stacks 220 in the electronic package 200.

Figure 2B:
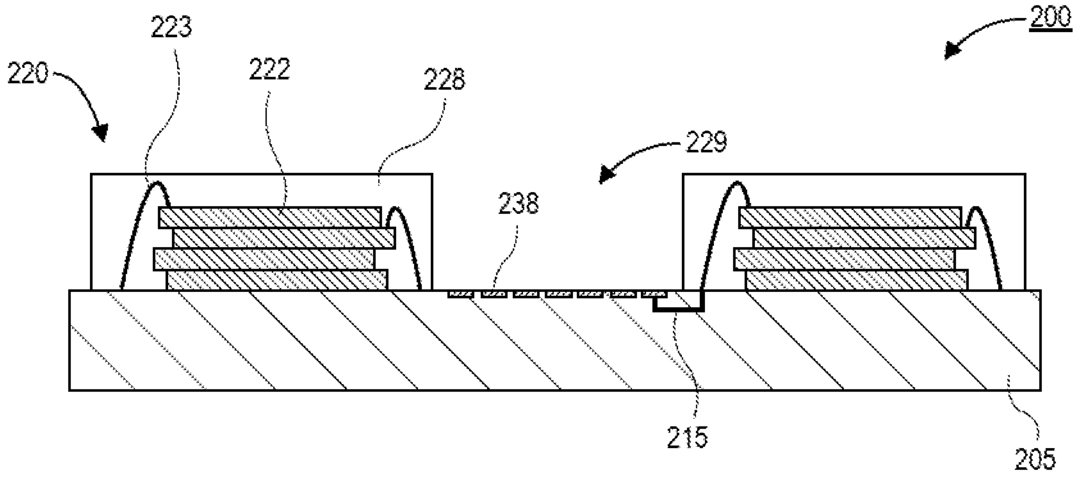
FIG. 2B is a cross-sectional illustration of the package substrate with memory die stacks that are embedded in the mold layer, in accordance with an embodiment.

Referring now to FIG. 2B, a cross-sectional illustration of an electronic package 200 is shown, in accordance with an embodiment. As shown, the memory die stacks 220 are directly coupled to the package substrate 205. That is, a bottommost memory die 222 is directly contacting the package substrate 205. In an embodiment, the memory dies 222 may be electrically coupled to pads (not shown) on the package substrate 205 by wire bonds 223. As used herein, a memory die stack 220 may refer to a stack of one or more memory dies 222. In a particular embodiment, four memory dies 222 are included in the memory die stack 220. The individual memory dies 222 may be stacked in an offset pattern. The offset pattern allows for the top surface of each of the memory dies 222 to be exposed in order to receive the wire bonds.

In an embodiment, the memory die stacks 220 may be embedded in a mold layer 228. The mold layer 228 may be around sidewalls and top surfaces of the memory dies 222. The wire bonds 223 may also be embedded in the mold layer 228. In the illustrated embodiment, the mold layer 228 appears as two separate regions (one region around each of the memory die stacks 220. However, it is to be appreciated that the two separate regions may be coupled together by portions of the mold layer 228 that are provided outside of the plane of FIG. 2B.

In an embodiment, an opening 229 may be provided through the mold layer 228. The opening 229 may be provided in the middle of the mold layer 228 in order to accommodate the die module (not shown in FIG. 2B). In an embodiment, pads 238 may be provided in the opening 229. The die module may be connected to the package substrate 205 through the pads 238. In an embodiment, certain ones of the pads 238 may be coupled to the wire bonds 223 of the memory die stack 220 by routing 215 in and/or on the package substrate 205.

Figure 3A:
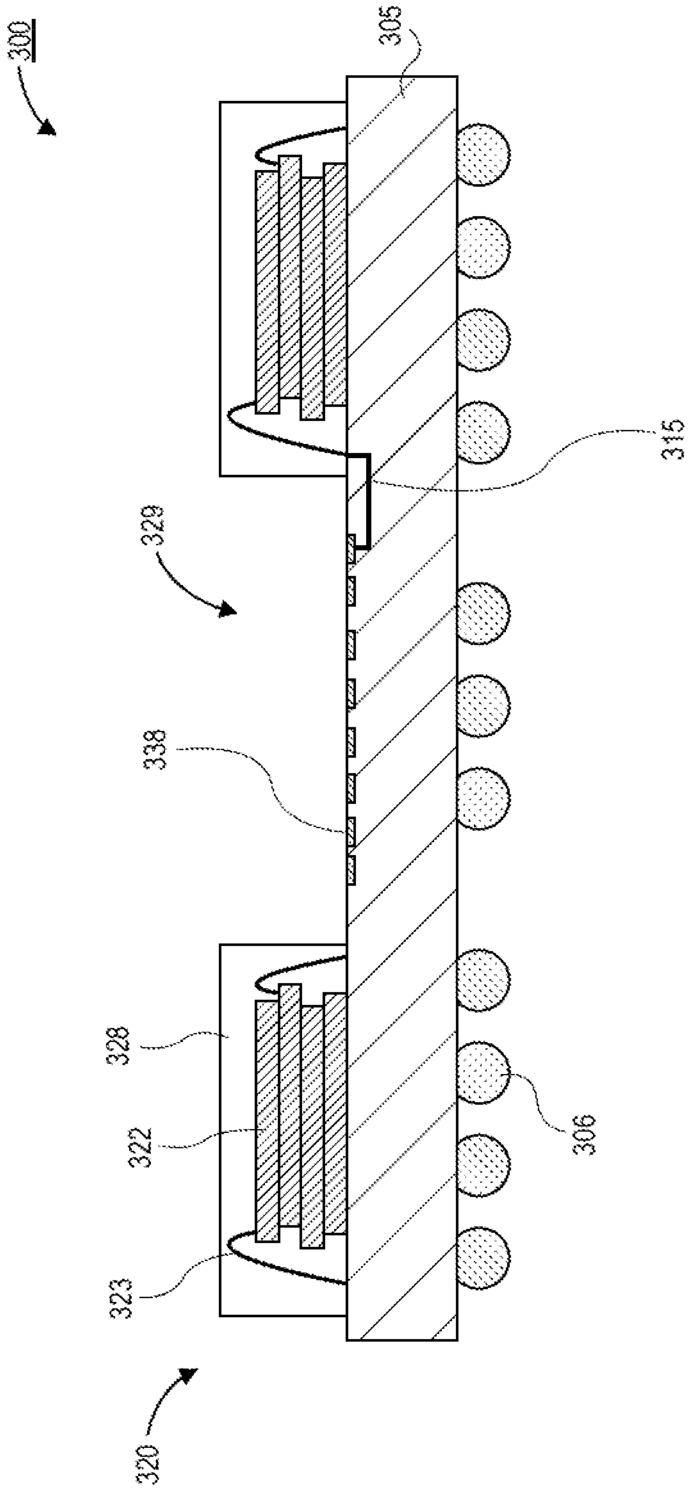
FIG. 3A is a cross-sectional illustration of a package substrate with memory die stacks that are embedded in the mold layer, in accordance with an additional embodiment.

Referring now to FIG. 3A, a cross-sectional illustration of an electronic package 300 is shown, in accordance with an embodiment. In an embodiment, the electronic package 300 comprises a package substrate 305. The package substrate 305 may be a cored package substrate 305 with any number of routing layers above and below the core. In an embodiment, solder balls 306 or the like may be provided on a backside of the package substrate 305.

In an embodiment, a pair of memory die stacks 320 may be provided over the package substrate 305. In an embodiment, the memory die stacks 320 may each include a plurality of memory dies 322 in a vertical stack. The memory dies 322 may be electrically and communicatively coupled to the package substrate 305 by wire bonds 323. In the illustrated embodiment, the memory die stacks 320 each include a set of four memory dies 322, though it is to be appreciated that any number of memory dies 322 may be provided in the memory die stacks 320.

In an embodiment, a mold layer 328 may be provided over and around the memory die stacks 320. The mold layer 328 may be an epoxy molding material or any other suitable material. In an embodiment, a thickness of the mold layer 328 may be greater than a height of the memory die stacks 320. The mold layer 328 may also embed the wire bonds 323. In an embodiment an opening 329 may be provided in the mold layer 328. The opening 329 may be located at an approximate center of the package substrate 305 in some embodiments. The opening 329 may expose pads 338 on the package substrate 305. Some of the pads 338 may be electrically coupled to the wire bonds 323 through routing 315 in and/or on the package substrate 305. In an embodiment, the mold layer 328 also functions as a stiffener. As such an additional stiffener is not needed and the XY form factor can be reduced.

Figure 3B:
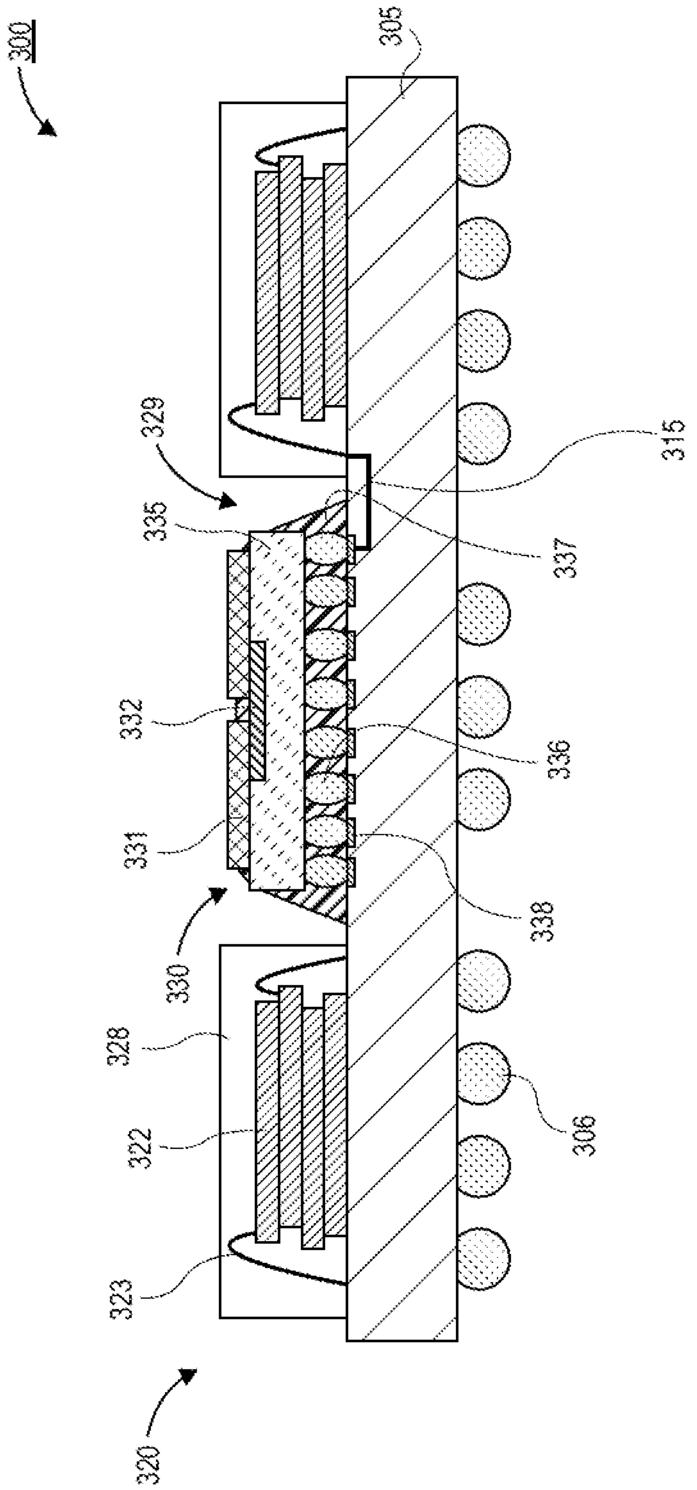
FIG. 3B is a cross-sectional illustration of a package substrate with memory die stacks, a mold layer, and a die module placed in an opening through the mold layer, in accordance with an embodiment.

Referring now to FIG. 3B, a cross-sectional illustration of the electronic package 300 after a die module 330 is attached to the pads 338 is shown, in accordance with an embodiment. In an embodiment, the die module 330 may be any kind of die module. For example, the die module 330 may be an SoC or the like. In the illustrated embodiment, the die module 330 includes a pair of dies 331. Though, it is to be appreciated that the die module 330 may include one or more dies 331 in other embodiments.

In an embodiment, the dies 331 may be communicatively coupled to each other by an interposer 335. The interposer 335 may be a mold material in some embodiments. In other embodiments, the interposer 335 may be a silicon substrate, a glass substrate, or the like. As shown, a bridge 332 may be embedded in the interposer 335. The bridge 332 may electrically and communicatively couple the pair of dies 331 together. For example, the bridge 332 may be a silicon bridge that allows for high density signal routing. The interposer 335 may be coupled to the pads 338 by interconnects 336. The interconnects 336 may be surrounded by an underfill 337.

In an embodiment, the height of the die module 330 may be substantially equal to the height of the mold layer 328. In other embodiments, the height of the die module 330 may be greater than the height of the mold layer 328. In such configurations, the presence of the mold layer 328 does not increase the Z-height of the electronic package 300.

Figure 4A:
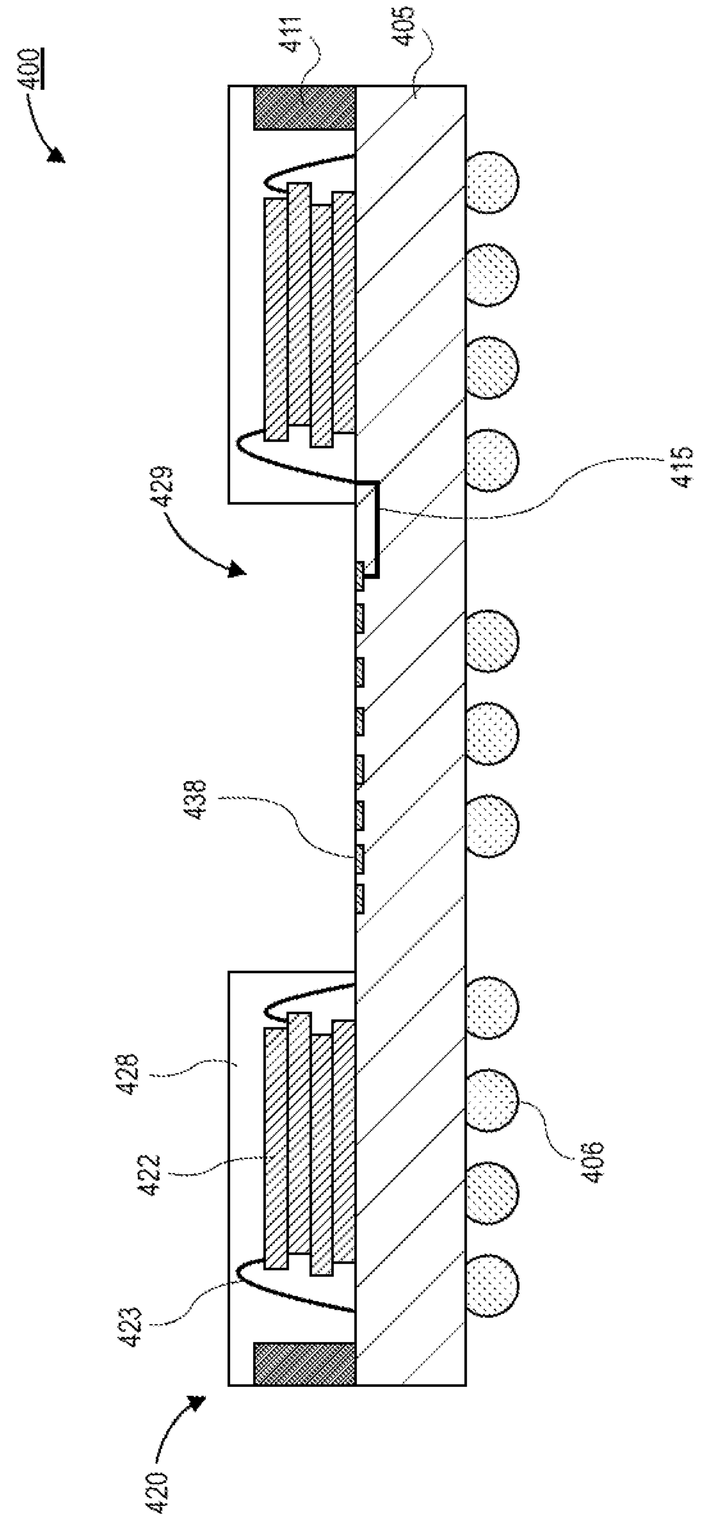
FIG. 4A is a cross-sectional illustration of a package substrate with memory die stacks and a stiffener embedded in a mold layer, in accordance with an embodiment.

Referring now to FIG. 4A, a cross-sectional illustration of an electronic package 400 is shown, in accordance with an embodiment. In an embodiment, the electronic package 400 comprises a package substrate 405. The package substrate 405 may be a cored package substrate 405 with any number of routing layers above and below the core. In an embodiment, solder balls 406 or the like may be provided on a backside of the package substrate 405.

In an embodiment, a pair of memory die stacks 420 may be provided over the package substrate 405. In an embodiment, the memory die stacks 420 may each include a plurality of memory dies 422 in a vertical stack. The memory dies 422 may be electrically and communicatively coupled to the package substrate 405 by wire bonds 423. In the illustrated embodiment, the memory die stacks 420 each include a set of four memory dies 422, though it is to be appreciated that any number of memory dies 422 may be provided in the memory die stacks 420.

In an embodiment, a mold layer 428 may be provided over and around the memory die stacks 420. The mold layer 428 may be an epoxy molding material or any other suitable material. In an embodiment, a thickness of the mold layer 428 may be greater than a height of the memory die stacks 420. The mold layer 428 may also embed the wire bonds 423. In an embodiment an opening 429 may be provided in the mold layer 428. The opening 429 may be located at an approximate center of the package substrate 405 in some embodiments. The opening 429 may expose pads 438 on the package substrate 405. Some of the pads 438 may be electrically coupled to the wire bonds 423 through routing 415 in and/or on the package substrate 405.

In an embodiment, a stiffener 411 may also be embedded in the mold layer 428. For example, the stiffener 411 may be at an outer edge of the mold layer 428. The stiffener 411 may be a metallic material, such as aluminum or the like. The stiffener 411 may have a height that is less than a height of the mold layer 428. In other embodiments, the stiffener 411 may be substantially the same height as the mold layer 428. The stiffener 411 may further improve the stiffness of the electronic package 400, compared to just having the mold layer 428.

Figure 4B:
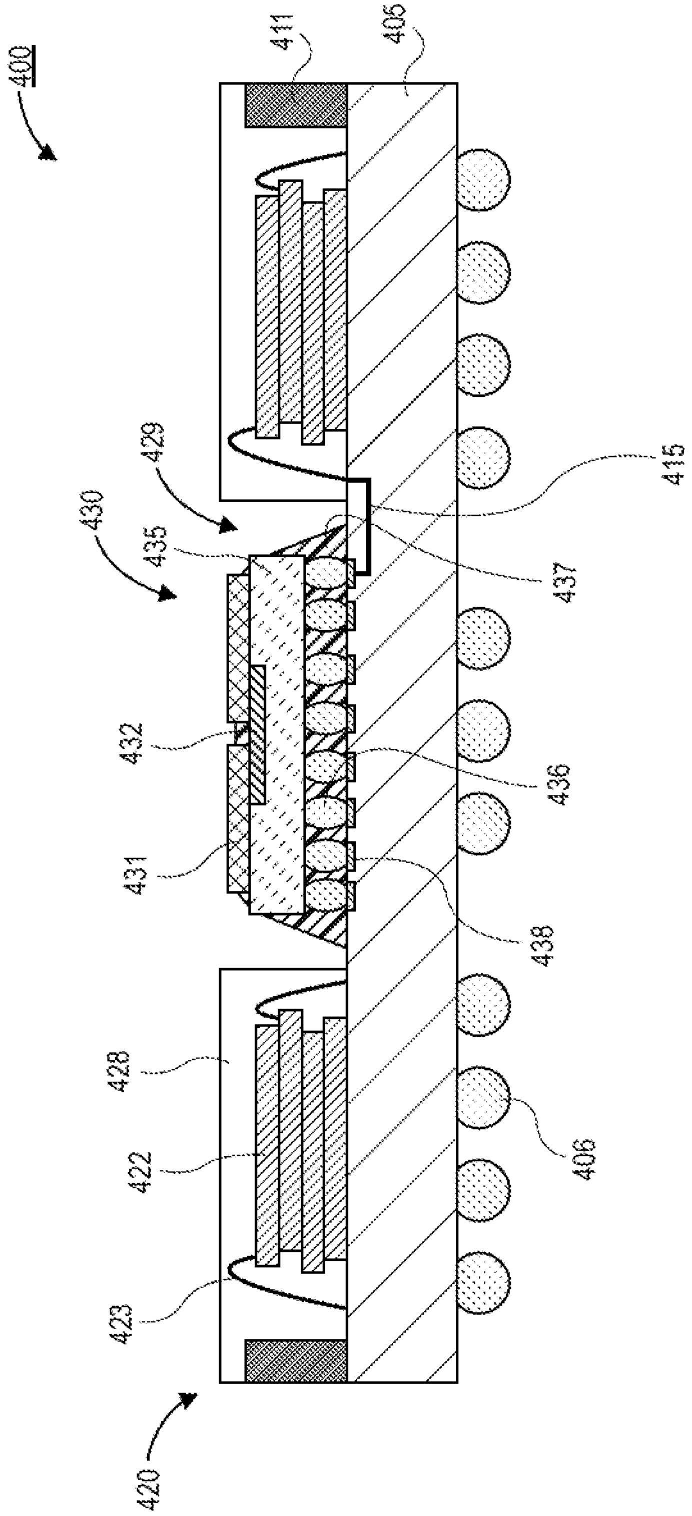
FIG. 4B is a cross-sectional illustration of a package substrate with memory die stacks, a stiffener, and a die module in an opening through the mold layer, in accordance with an embodiment.

Referring now to FIG. 4B, a cross-sectional illustration of the electronic package 400 after a die module 430 is attached to the pads 438 is shown, in accordance with an embodiment. In an embodiment, the die module 430 may be any kind of die module. For example, the die module 430 may be an SoC or the like. In the illustrated embodiment, the die module 430 includes a pair of dies 431. Though, it is to be appreciated that the die module 430 may include one or more dies 431 in other embodiments.

In an embodiment, the dies 431 may be communicatively coupled to each other by an interposer 435. The interposer 435 may be a mold material in some embodiments. In other embodiments, the interposer 435 may be a silicon substrate, a glass substrate, or the like. As shown, a bridge 432 may be embedded in the interposer 435. The bridge 432 may electrically and communicatively couple the pair of dies 431 together. For example, the bridge 432 may be a silicon bridge that allows for high density signal routing. The interposer 435 may be coupled to the pads 438 by interconnects 436. The interconnects 436 may be surrounded by an underfill 437.

In an embodiment, the height of the die module 430 may be substantially equal to the height of the mold layer 428. In other embodiments, the height of the die module 430 may be greater than the height of the mold layer 428. In such configurations, the presence of the mold layer 428 does not increase the Z-height of the electronic package 400. A stiffener 411 may be provided in the mold layer 428 in some embodiments.

Figure 5:
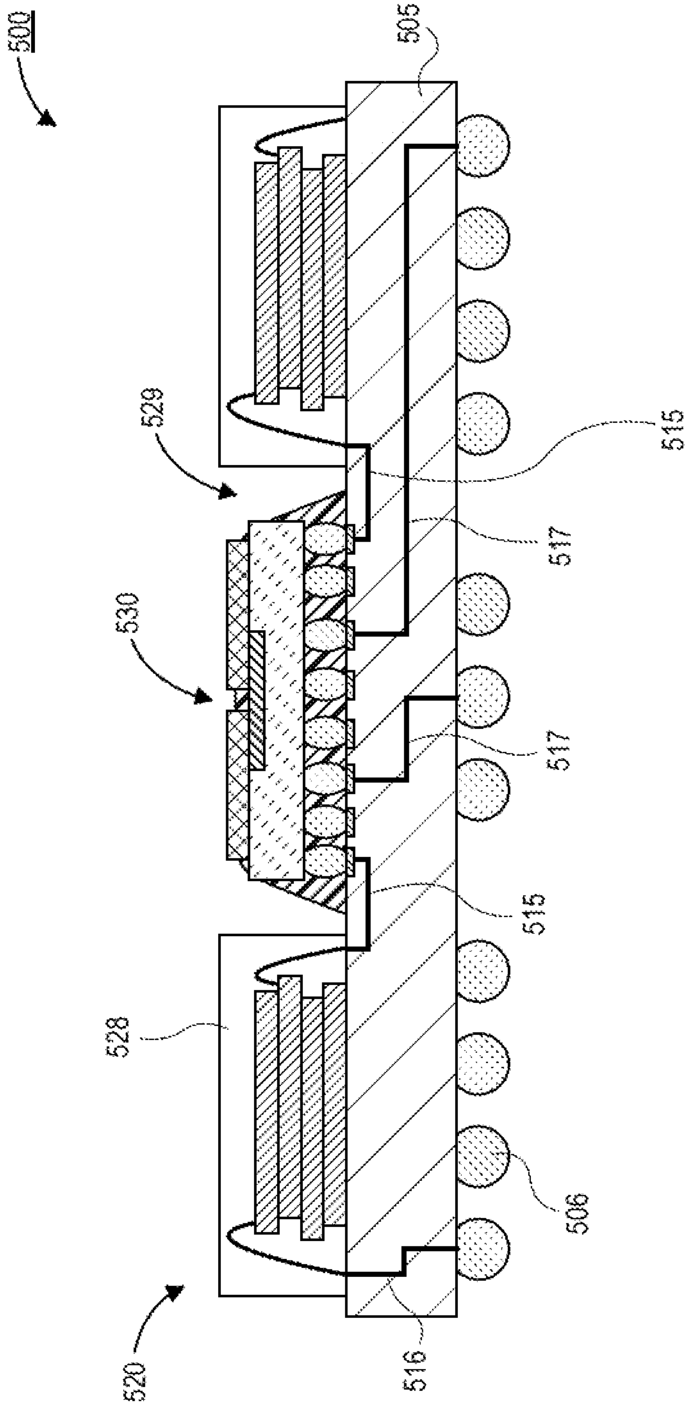
FIG. 5 is a cross-sectional illustration of a package substrate with memory die stacks, a die module, and a mold layer, with selected interconnects through the package substrate shown, in accordance with an embodiment.

Referring now to FIG. 5, a cross-sectional illustration of an electronic package 500 is shown, in accordance with an embodiment. In an embodiment, the electronic package 500 in FIG. 5 may be substantially similar to the electronic package 300 shown in FIG. 3B. For example, the electronic package 500 may include a package substrate 505 with a pair of memory die stacks 520 provided on the top side of the package substrate 505. The memory die stacks 520 may be embedded in a mold layer 528. The mold layer 528 may include an opening 529. A die module 530 may be provided in the opening 529 over the top side of the package substrate 505.

In the embodiment shown in FIG. 5, a plurality of routing layers are shown in the package substrate. For example, traces 515 provide coupling between the memory die stacks 520 and the die module 530. Traces 517 provide coupling between the die module 530 and the balls 506, and traces 516 provide coupling between the memory die stacks 520 and the balls 506.

Referring now to FIGS. 6A-6E, a series of cross-sectional illustrations depicting a process for forming an electronic package 600 is shown, in accordance with an embodiment. In an embodiment, the process shown in FIGS. 6A-6E or similar process flows may be used to assemble any of the electronic packages disclosed herein.

Figure 6A:
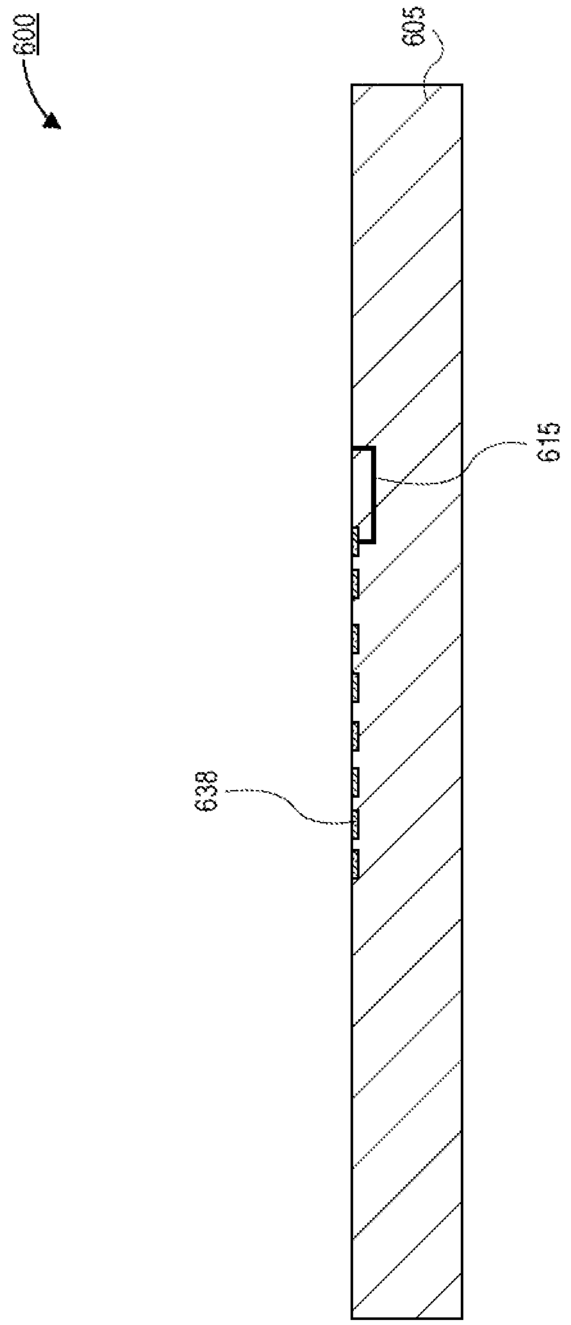
FIG. 6A is a cross-sectional illustration of a package substrate, in accordance with an embodiment.

Referring now to FIG. 6A, a cross-sectional illustration of an electronic package 600 is shown, in accordance with an embodiment. In an embodiment, the electronic package 600 may comprise a package substrate 605. The package substrate 605 may be a cored substrate with buildup layers over and under the core. In an embodiment, conductive routing 615 may be provided in the package substrate 605. For example, the conductive routing 615 may be coupled between pads 638 for the die module (not shown) and the wire bonds for the memory die stack.

Figure 6B:
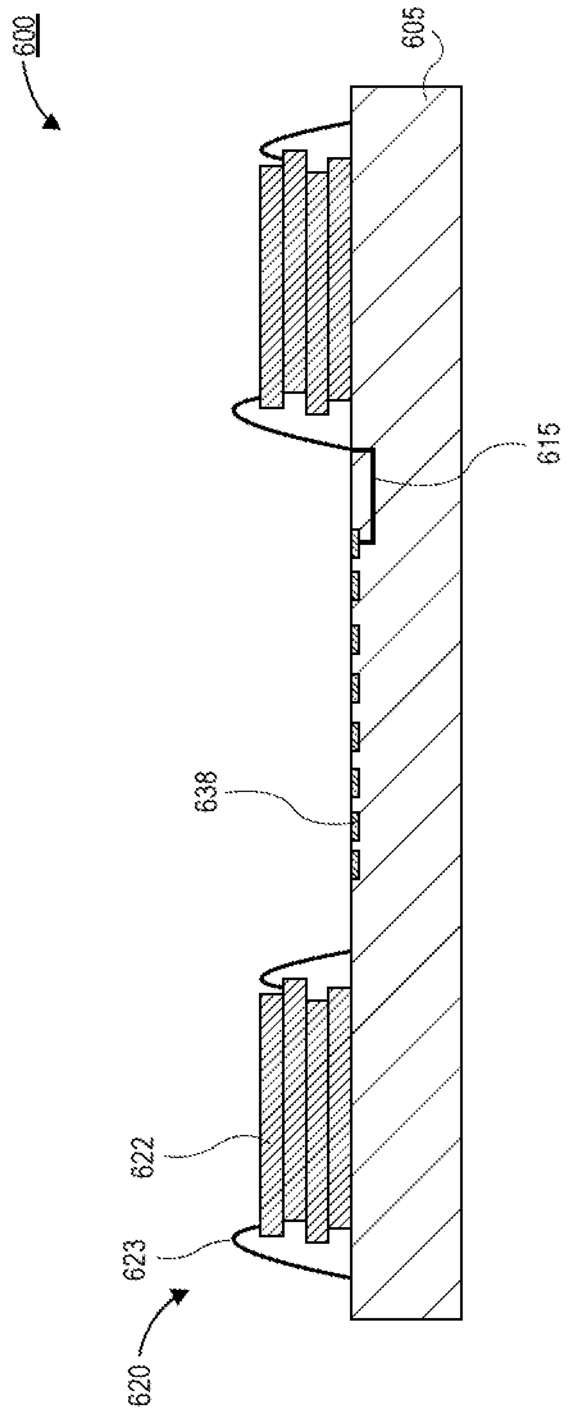
FIG. 6B is a cross-sectional illustration of the package substrate after memory die stacks are attached to the package substrate, in accordance with an embodiment.

Referring now to FIG. 6B, a cross-sectional illustration of the electronic package 600 after the memory die stacks 620 are placed on the package substrate 605 is shown, in accordance with an embodiment. In an embodiment, the memory die stacks 620 may each include one or more memory dies 622. For example, each of the memory die stacks 620 in FIG. 6B include four memory dies 622. The individual dies 622 may be stacked in an offset pattern. The offset pattern allows for a top surface of each of the memory dies 622 to be exposed. Wire bonds 623 from the top surface of the memory dies 622 may be connected directly to pads (not shown) on the package substrate 605. As such, there is no need for a dedicated memory package substrate. This decreases the distance between the memory dies 622 and the die module (not shown), and may enable higher frequency operation of the electronic package 600.

Figure 6C:
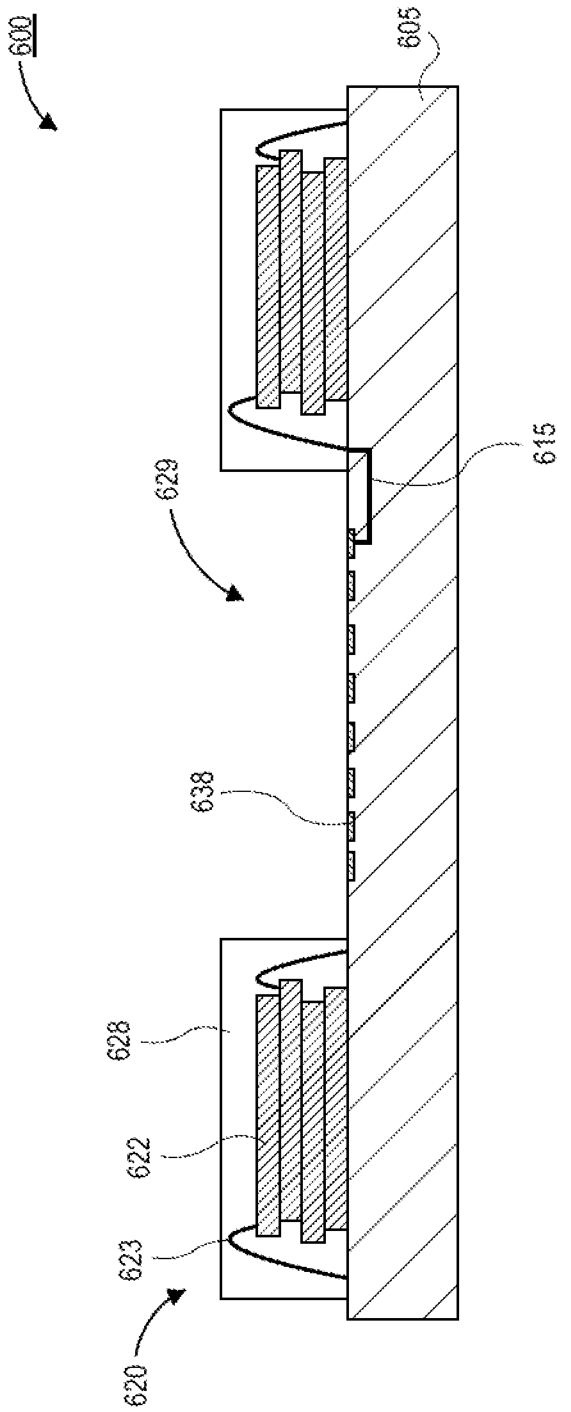
FIG. 6C is a cross-sectional illustration of the package substrate after a mold layer with an opening is formed over and around the memory die stacks, in accordance with an embodiment.

Referring now to FIG. 6C, a cross-sectional illustration of the electronic package 600 after a mold layer 628 is formed is shown, in accordance with an embodiment. In an embodiment, the mold layer 628 may be an epoxy material or the like. The molding process may include a cutout in order to form an opening 629 in the middle of the mold layer 628. In other embodiments, the opening 629 may be formed with an etching process that selectively removes the material of the mold layer 628. In an embodiment, the mold layer 628 may embed the memory die stacks 620. For example, the top surfaces and sidewall surfaces of the memory dies 622 may be contacted by the mold layer 628. In the illustrated embodiment, each of the memory die stacks 620 appear to be covered by different mold layers 628. However, it is to be appreciated that the mold layer 628 may continue out of the plane of FIG. 6C in order to form a single structure over all of the memory die stacks 620.

Figure 6D:
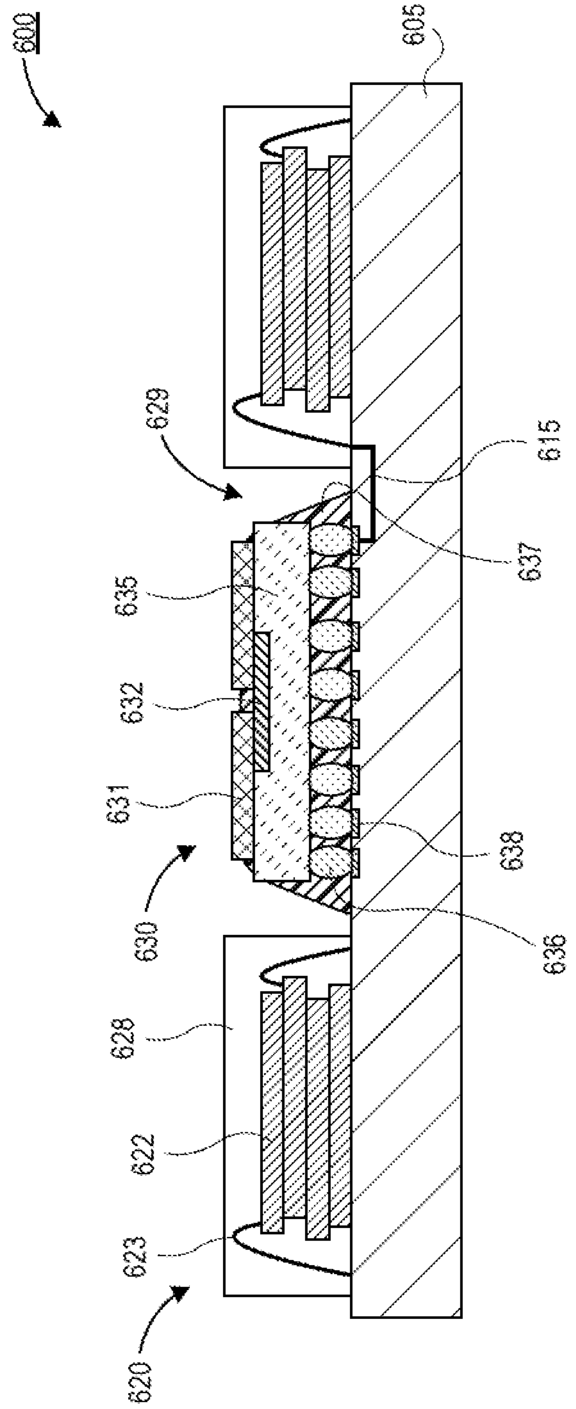
FIG. 6D is a cross-sectional illustration of the package substrate after a die module is inserted into the opening through the mold layer, in accordance with an embodiment.

Referring now to FIG. 6D, a cross-sectional illustration of the electronic package 600 after a die module 630 is attached to the package substrate 605 is shown, in accordance with an embodiment. In an embodiment, the die module 630 may be connected to pads 638 by interconnects 636. The interconnects 636 may be surrounded by an underfill 637. The die module 630 may include one or more dies 631. For example a pair of dies 631 are shown in FIG. 6D. The dies 631 may be coupled together by an interposer 635. In the illustrated embodiment, a bridge 632 is provided in the interposer 635 in order to couple together the dies 631. In an embodiment, a height of the die module 630 may be substantially equal to a height of the mold layer 628. In other embodiments, the height of the die module 630 may be greater than a height of the mold layer 628. As such, the inclusion of the mold layer 628 does not increase the Z-height of the electronic package 600. Additionally, the mold layer 628 may function as a stiffener in order to reduce warpage of the package substrate 605.

Figure 6E:
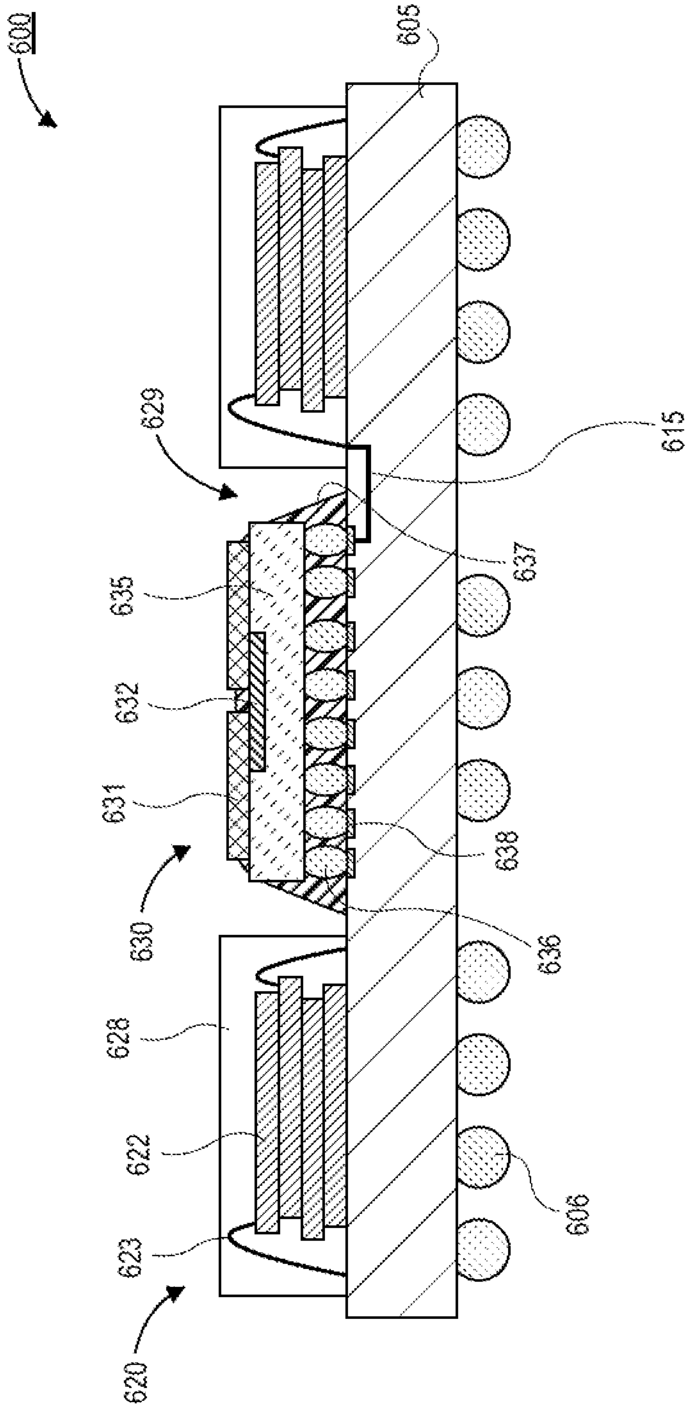
FIG. 6E is a cross-sectional illustration of the package substrate after balls are attached to the backside surface of the package substrate, in accordance with an embodiment.

Referring now to FIG. 6E, a cross-sectional illustration of the electronic package 600 after balls 606 are attached to the package substrate 605 is shown, in accordance with an embodiment. While shown as solder balls, it is to be appreciated that balls 606 may include any type of interconnect architecture.

Figure 7:
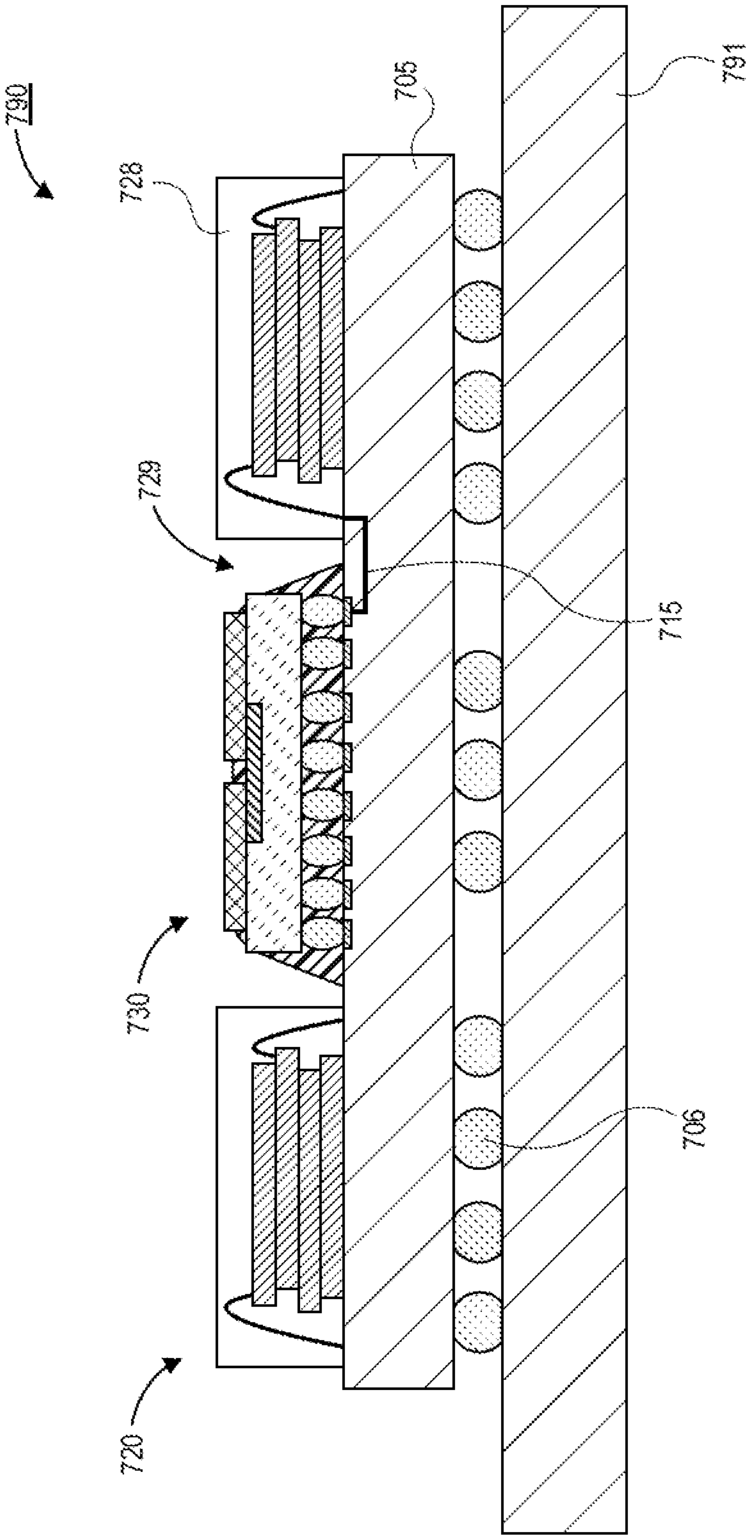
FIG. 7 is a cross-sectional illustration of an electronic system with a board, a package substrate coupled to the board, memory die stacks embedded in a mold layer, and a die module through an opening in the mold layer, in accordance with an embodiment.

Referring now to FIG. 7, a cross-sectional illustration of an electronic system 790 is shown, in accordance with an embodiment. In an embodiment, the electronic system 790 may include a board 791, such as a printed circuit board (PCB) or the like. In an embodiment, the board 791 is coupled to a package substrate 705 by interconnects 706. While shown as solder balls, it is to be appreciated that interconnects 706 may include any interconnect architecture.

In an embodiment, a die module 730 may be provided over the package substrate 705. The die module 730 may be inserted through an opening 729 through a mold layer 728. The mold layer 728 may embed one or more memory die stacks 720. The memory die stacks 720 may be directly coupled to the package substrate 705 without an intervening package substrate layer. As such, the interconnect 715 between the memory die stacks 720 and the die module 730 is reduced in length.

In an embodiment, the electronic package shown in FIG. 7 is substantially similar to the electronic package 300 in FIG. 3B. However, it is to be appreciated that the electronic system 790 may include any electronic package described herein, in accordance with various embodiments.

Figure 8:
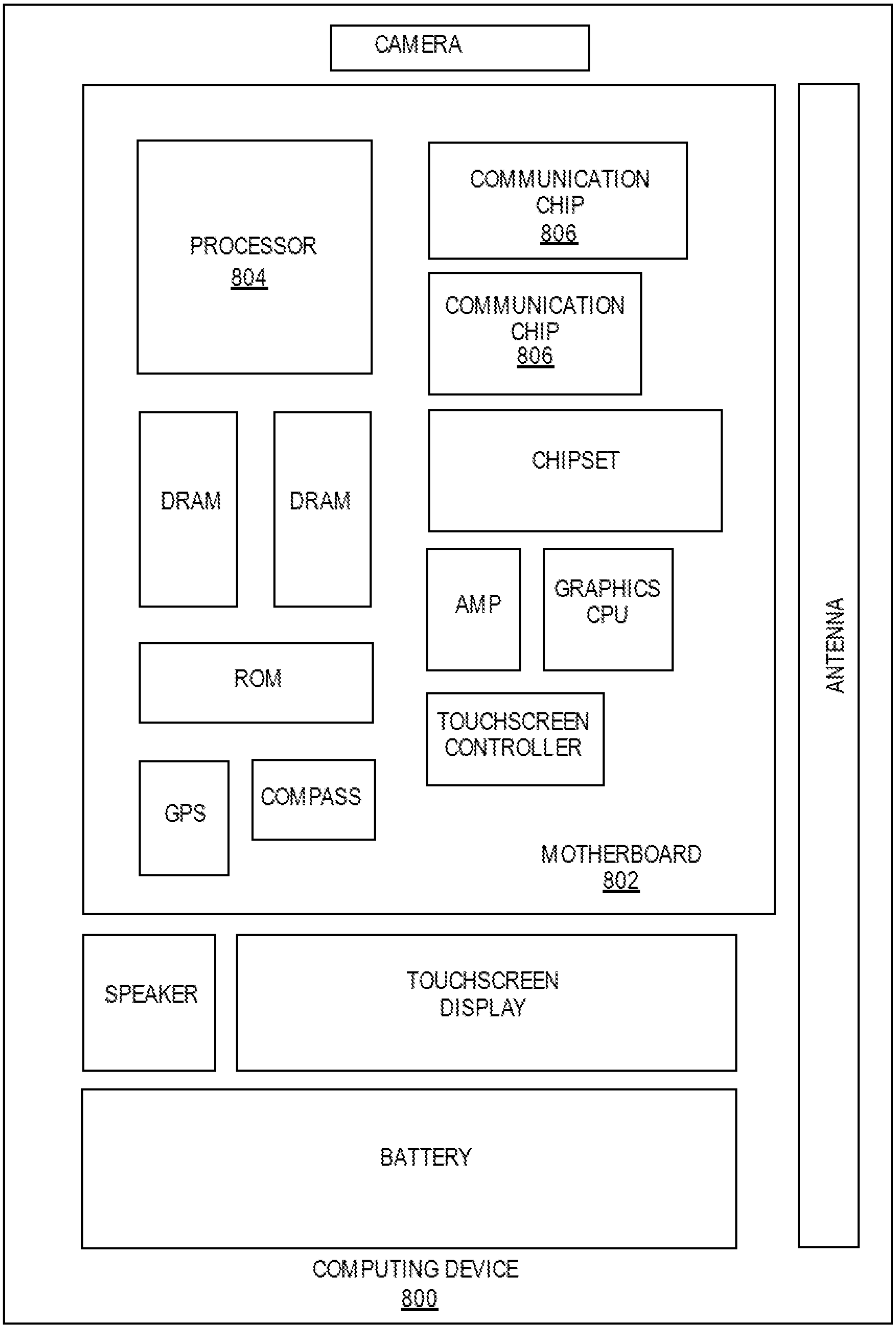
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be part of an electronic system that comprises one or more memory die stacks that are embedded in a mold layer and directly coupled to the package substrate, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be part of an electronic system that comprises one or more memory die stacks that are embedded in a mold layer and directly coupled to the package substrate, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a first memory die stack on the package substrate; a second memory die stack on the package substrate; an electrically insulating layer over the first memory die stack and the second memory die stack; an opening through the electrically insulating layer; and a die module in the opening over the package substrate.

Example 2: the electronic package of Example 1, wherein the first memory die stack and the second memory die stack are electrically coupled to the package substrate by wire bonds.

Example 3: the electronic package of Example 2, wherein the first memory die stack and the second memory die stack are electrically coupled to the die module by interconnects in the package substrate.

Example 4: the electronic package of Examples 1-3, wherein the die module is a system on a chip (SoC).

Example 5: the electronic package of Examples 1-4, wherein the die module comprises a first die and a second die.

Example 6: the electronic package of Example 5, wherein the first die is coupled to the second die by a bridge embedded in an interposer below the first die and the second die.

Example 7: the electronic package of Example 6, wherein the interposer is coupled to the package substrate by solder balls.

Example 8: the electronic package of Examples 1-7, further comprising a stiffener around the first memory die stack and the second memory die stack.

Example 9: the electronic package of Example 8, wherein the stiffener is embedded in the electrically insulating layer.

Example 10: the electronic package of Example 9, wherein a height of the stiffener is less than a height of the electrically insulating layer.

Example 11: the electronic package of Examples 1-10, further comprising: a third memory die stack on the package substrate; and a fourth memory die stack on the package substrate.

Example 12: the electronic package of Examples 1-12, wherein the first memory die stack and the second memory die stack each comprise four or more memory dies, and wherein each of the four or more memory dies are wire bonded directly to the package substrate.

Example 13: a method of forming an electronic package, comprising: providing a package substrate; attaching a first memory die stack and a second memory die stack to the package substrate; forming a mold layer over the first memory die stack and the second memory die stack, wherein an opening is provided through the mold layer between the first memory die stack and the second memory die stack; and attaching a die module to the package substrate in the opening.

Example 14: the method of Example 13, wherein the first memory die stack and the second memory die stack are coupled to the package substrate by wire bonds.

Example 15: the method of Example 13 or Example 14, wherein the first memory die stack and the second memory die stack each include four our more memory dies.

Example 16: the method of Examples 13-15, wherein the die module comprises a plurality of dies.

Example 17: the method of Example 16, wherein the plurality of dies are provided on an interposer, and wherein the interposer is coupled to the package substrate.

Example 18: the method of Example 17, wherein the plurality of dies are coupled to each other through a bridge embedded in the interposer.

Example 19: the method of Examples 13-18, wherein the die module is a system on a chip (SoC).

Example 20: the method of Examples 13-19, further comprising: attaching a stiffener to the package substrate around the first memory die stack and the second memory die stack.

Example 21: the method of Example 20, wherein the stiffener is embedded in the mold layer.

Example 22: the method of Examples 13-21, further comprising: attaching a third memory die stack and a fourth memory dies stack to the package substrate, wherein the third memory die stack and the fourth memory die stack are embedded in the mold layer.

Example 23: an electronic system, comprising: a board; a package substrate coupled to the board; a first memory die stack coupled to the package substrate; a second memory die stack coupled to the package substrate; a stiffener on the package substrate, wherein the first memory die stack and the second memory die stack are embedded in the stiffener; and a die module coupled to the package substrate and positioned in within an inner diameter of the stiffener.

Example 24: the electronic system of Example 23, wherein the first memory die stack and the second memory die stack are coupled to the package substrate by wire bonds.

Example 25: the electronic system of Example 23 or Example 24, wherein the stiffener is a mold layer.

What is claimed is:

1. An electronic package, comprising:

a package substrate;

a first memory die stack on the package substrate;

a second memory die stack on the package substrate;

an electrically insulating layer over the first memory die stack and the second memory die stack;

an opening through the electrically insulating layer; and a die module in the opening over the package substrate, the die module laterally spaced apart from the electrically insulating layer.

2. The electronic package of claim 1, wherein the first memory die stack and the second memory die stack are electrically coupled to the package substrate by wire bonds.

3. The electronic package of claim 2, wherein the first memory die stack and the second memory die stack are electrically coupled to the die module by interconnects in the package substrate.

4. The electronic package of claim 1, wherein the die module is a system on a chip (SoC).

5. The electronic package of claim 1, wherein the die module comprises a first die and a second die.

6. The electronic package of claim 5, wherein the first die is coupled to the second die by a bridge embedded in an interposer below the first die and the second die.

7. The electronic package of claim 6, wherein the interposer is coupled to the package substrate by solder balls.

8. The electronic package of claim 1, further comprising a stiffener around the first memory die stack and the second memory die stack.

9. The electronic package of claim 8, wherein the stiffener is embedded in the electrically insulating layer.

10. The electronic package of claim 9, wherein a height of the stiffener is less than a height of the electrically insulating layer.

11. The electronic package of claim 1, further comprising:

a third memory die stack on the package substrate; and a fourth memory die stack on the package substrate.

12. The electronic package of claim 1, wherein the first memory die stack and the second memory die stack each comprise four or more memory dies, and wherein each of the four or more memory dies are wire bonded directly to the package substrate.

13. An electronic system, comprising:

a board;

a package substrate coupled to the board;

a first memory die stack coupled to the package substrate;

a second memory die stack coupled to the package substrate;

a stiffener on the package substrate, wherein the first memory die stack and the second memory die stack are embedded in the stiffener; and a die module coupled to the package substrate and positioned within an inner diameter of the stiffener.

14. The electronic system of claim 13, wherein the first memory die stack and the second memory die stack are coupled to the package substrate by wire bonds.

15. The electronic system of claim 13, wherein the stiffener is a mold layer.

16. An electronic package, comprising:

a package substrate;

a first memory die stack on the package substrate;

a second memory die stack on the package substrate;

an electrically insulating layer over the first memory die stack and the second memory die stack;

an opening through the electrically insulating layer; and a die module in the opening over the package substrate, wherein the die module comprises a first die and a second die, and wherein the first die is coupled to the second die by a bridge embedded in an interposer below the first die and the second die.

17. The electronic package of claim 16, wherein the interposer is coupled to the package substrate by solder balls.

18. An electronic package, comprising:

a package substrate;

a first memory die stack on the package substrate;

a second memory die stack on the package substrate;

an electrically insulating layer over the first memory die stack and the second memory die stack;

an opening through the electrically insulating layer;

a die module in the opening over the package substrate; and a stiffener around the first memory die stack and the second memory die stack.

19. The electronic package of claim 18, wherein the stiffener is embedded in the electrically insulating layer.

20. The electronic package of claim 19, wherein a height of the stiffener is less than a height of the electrically insulating layer.

* * * * *